United States Patent
Benz et al.

(10) Patent No.: US 6,236,344 B1
(45) Date of Patent: May 22, 2001

(54) AC AND DC BIPOLAR VOLTAGE SOURCE USING QUANTIZED PULSES

(75) Inventors: Samuel P. Benz, Superior; Clark A. Hamilton, Boulder; Charles J. Burroughs, Lafayette; Todd E. Harvey, Erie, all of CO (US)

(73) Assignee: The United States of America, as represented by the Secretary of Commerce, Washington, DC (US)

( * ) Notice: Subject to any disclaimer, the term of this patent is extended or adjusted under 35 U.S.C. 154(b) by 0 days.

(21) Appl. No.: 09/347,245

(22) Filed: Jul. 2, 1999

Related U.S. Application Data

(60) Provisional application No. 60/091,639, filed on Jul. 2, 1998.

(51) Int. Cl.[7] .................................................. H03M 1/00
(52) U.S. Cl. ............................................ 341/133; 341/143
(58) Field of Search ................................... 341/133, 143, 341/171

(56) References Cited

U.S. PATENT DOCUMENTS

| | | | |
|---|---|---|---|
| 4,983,971 | * | 1/1991 | Przybysz et al. .................... 341/133 |
| 5,198,815 | * | 3/1993 | Przybysz et al. .................... 341/133 |
| 5,327,130 | * | 7/1994 | Kang et al. .......................... 341/133 |
| 5,341,136 | * | 8/1994 | Przybysz et al. .................... 341/133 |
| 5,565,866 | * | 10/1996 | Hamilton et al. ................... 341/133 |
| 5,731,717 | | 3/1998 | Ohshima et al. . |
| 5,798,722 | * | 8/1998 | Przybysz et al. .................... 341/133 |
| 5,812,078 | | 9/1998 | Przybysz et al. . |
| 5,821,556 | | 10/1998 | Chew et al. . |
| 5,845,220 | | 12/1998 | Puthoff et al. . |
| 5,854,604 | | 12/1998 | Przybysz et al. . |
| 5,869,846 | | 2/1999 | Higashino et al. . |
| 5,880,647 | | 3/1999 | Kim . |
| 5,909,086 | | 6/1999 | Kim et al. . |

OTHER PUBLICATIONS

Hamilton & Benz, "A pulse–driven programmable Josephson voltage standard," Appl. Phys. Lett. 68 (22), May 27, 1996, pp. 3171–3173.

Benz, Burroughs & Hamilton, "Operating Margins for a Pulse–Driven Programmable Voltage Standard," *IEEE Transactions on Applied Superconductivity*, vol. 7, No. 2, 6/97, pp. 2653–2656.

Benz, Hamilton, Burroughs, Harvey, Christian & Przybysz, "Pulse–Driven Josephson Digiital/Analog Converter," *IEEE Transactions on Applied Superconductivity*, vol. 87, No. 2, 6/98, pp. 42–47.

Hamilton, Burroughs & Kautz, "Josephson D/A Converter with Fundamental Accuracy," IEEE Transactions on Instrumentation and Measurement, vol. 44, No. 2, 4/95, pp. 223–225.

(List continued on next page.)

*Primary Examiner*—Peguy JeanPierre
*Assistant Examiner*—Jean Bruner Jeanglaude
(74) *Attorney, Agent, or Firm*—Charles E. Rohrer

(57) ABSTRACT

A Josephson quantizer is driven by a sinusoidal microwave generator whose output is combined with a digital two-level code representing a desired waveform. The result is to produce a bipolar drive signal of increased frequency and a bipolar Josephson output with voltage increased significantly. Output voltage is developed according to the relationship $V = Nnmf_s/K_J$, where N is the number of junctions, n is the Josephson junction constant voltage step number, $f_s$ is the sampling frequency, m is an integer multiple of the sampling frequency and is $\geq 2$, and $K_J$ is the Josephson constant. The digital code generator receives the output of an improved modulator which incorporates a three-level to two-level transformation on the output of a standard three-level modulator in one embodiment. In a second embodiment, a modified two-level modulator produces a bit sequence where the polarity of the next bit is allowed to change only if there is an odd number of consecutive bits of the same polarity.

21 Claims, 6 Drawing Sheets

OTHER PUBLICATIONS

Benz, "Superconductor–normal–superconductor junctions for programmable voltage standards," Appl. Phys. Lett. 67 (18), Oct. 30, 1995, pp. 2714–2716.

Benz, Hamilton, Burroughs, Harvey & Christian, "Stable 1 volt programmable voltage standard," Appl. Phys. Lett. 71 (13), Sep. 29, 1997, pp. 1866–1868.

Steiner, Gillespie, Fujii, Williams, Newell, Picard, Stenbakken & Olson, "The NIST Watt Balance: Progress Toward Monitoring the Kilogram," IEE Transactions on Instrumentation and Measurement, vol. 46, No. 2, 4/97, pp. 607–604.

Hamilton, Burroughs, Benz & Kinard, "AC Josephson Voltage Standard: Progress Report, "IEEE Transactions on Instrumentation and Measurement, vol. 46, No. 2, 4/97, pp. 224–228.

Wiesenfeld, Benz & Booi, "Phase–locked oscillator optimization for arrays of Josephson Junctions," J. Appl. Phys.. 76 (6), Sep. 15, 1994, pp. 3835–3845.

* cited by examiner

OUTPUT SPECTRUM - DIGITAL CODE GEN

OUTPUT SPECTRUM - JOSEPHSON QUANTIZER

OUTPUT SPECTRUM - DIGITAL CODE GEN

OUTPUT SPECTRUM - JOSEPHSON QUANTIZER

AC AND DC BIPOLAR VOLTAGE SOURCE USING QUANTIZED PULSES

This application claims the benefit of the U.S. Provisional Application No. 60/091,639 filed Jul. 2, 1998.

This invention relates to a circuit for waveform generation wherein arrays of Josephson junctions are biased by combining a broadband two-level digital code and a sinusoidal frequency to produce a highly accurate bipolar voltage source.

BACKGROUND OF THE INVENTION

A wide variety of instrumentations exist to measure voltage. All of these instrumentations must be calibrated to provide accurate measurements. In the field of ac and dc metrology, instruments are devised to provide exact measurements of voltage so that other instruments can be calibrated to them. The Josephson junction has been utilized in metrology to take advantage of its quantum mechanical characteristics wherein time integrated areas of every generated voltage pulse are exactly the same regardless of the shape of the pulse as long as the device is driven at or above the critical current. When biased with a sinusoidal microwave frequency f, each junction exhibits constant voltage steps at $V=nf/K_J$. The Josephson frequency to voltage ratio $K_J$ is a defined constant equal to 2 e/h which is the ratio of twice the electron charge and Planck's constant. $K_J$ is equal to 483,597.9 GHz/V. When biased on each nth step, a junction generates exactly n quantized voltage pulses for each microwave period. For an array of N junctions, the time average dc voltage of the $n^{th}$ step is $Vn=nNf/K_J$ where N is the number of Josephson junctions.

Synthesized voltage sources utilizing Josephson technology have been proposed and developed for unipolar ac and dc voltages that control pulses of a single polarity. The object of this invention is to devise a Josephson circuit for accurate, stable, arbitrary waveform generation with a predetermined frequency spectrum which will enable synthesis of both ac and dc bipolar waveforms where voltage pulses of both positive and negative polarity are precisely controlled and used to increase the output voltage.

SUMMARY OF THE INVENTION

Briefly stated, this invention is a circuit which provides a Josephson junction or series array of junctions driven with the combination of a sinusoidal microwave frequency and digital pulses. The digital pulses correspond to the mathematical model of a desired waveform. That waveform may be an ac waveform or any dc waveform that can be generated using a digital code of appropriate pattern and length. The combination of the sinusoidal drive and the digital pulses is used to current bias a Josephson quantizer. Output of the quantizer is fed into a standard filter to remove unwanted noise and thereby produce the desired waveform. Knowledge of the digital code, the drive frequency and the number of Josephson junctions is sufficient to precisely calculate the waveform output and in that manner enable highly accurate physical reproductions of the mathematical model.

DETAILED DESCRIPTION

Figure 1:
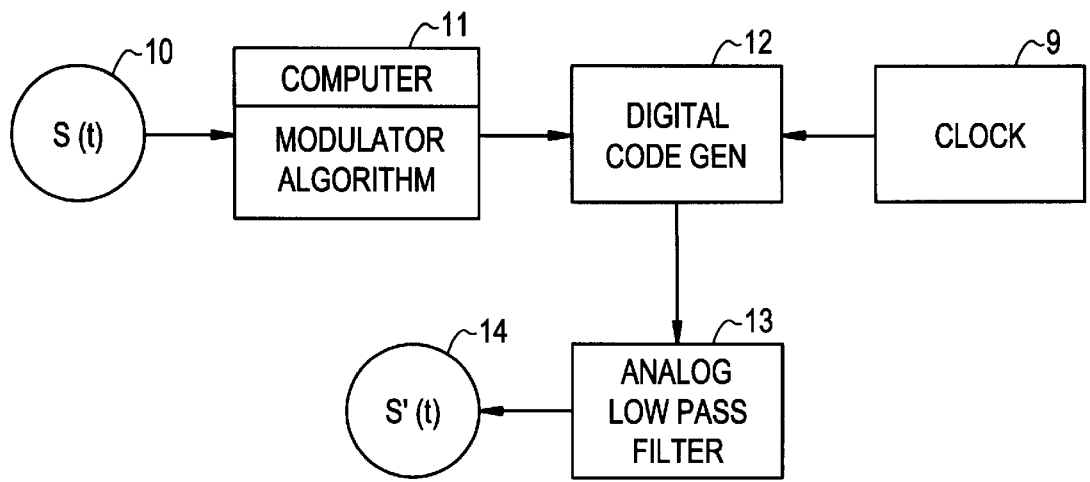
FIGS. 1 and 2 show prior art circuits for physically synthesizing a waveform corresponding to a mathematical model.

When reference is made to the drawing, like numerals indicate like parts and structural features in the various figures.

FIG. 1 shows a prior art circuit for synthesizing a physical waveform from digital pulses which correspond to an input mathematical model. In FIG. 1 a mathematical model of the desired waveform 10 is input to a computer 11 in which a modulator algorithm is used to produce a sequence of zeroes and ones, that is, a digital code corresponding to the input waveform. The digital code can be generated to that number of binary decimals needed to obtain the accuracy desired. A digital code generator 12 receives the output sequence of the modulator algorithm for storage in its memory and utilizes that sequence to generate a two-level electrical signal which is a physical signal representing the digital code. Since that code corresponds to the mathematical model 10 of the desired waveform when the two-level signal is passed through an analog low pass filter 13, a physical representation of the mathematical model is produced at 14.

The circuit of FIG. 1 has been in use for many years but it leaves much to be desired in producing an output 14 which is exactly the same as the mathematical model 10. The semiconductor digital code generator 12 cannot perfectly reproduce the ideal digital code because of voltage variations in its levels and phase or timing variations in transitions between levels. Those variations prevent the digital code generator from synthesizing a signal of metrological accuracy. For example, if a sine wave is desired, the output 14 would not correspond exactly to the mathematical model of a sine wave, and consequently cannot be utilized as a highly accurate standard circuit for metrology purposes.

Figure 2:
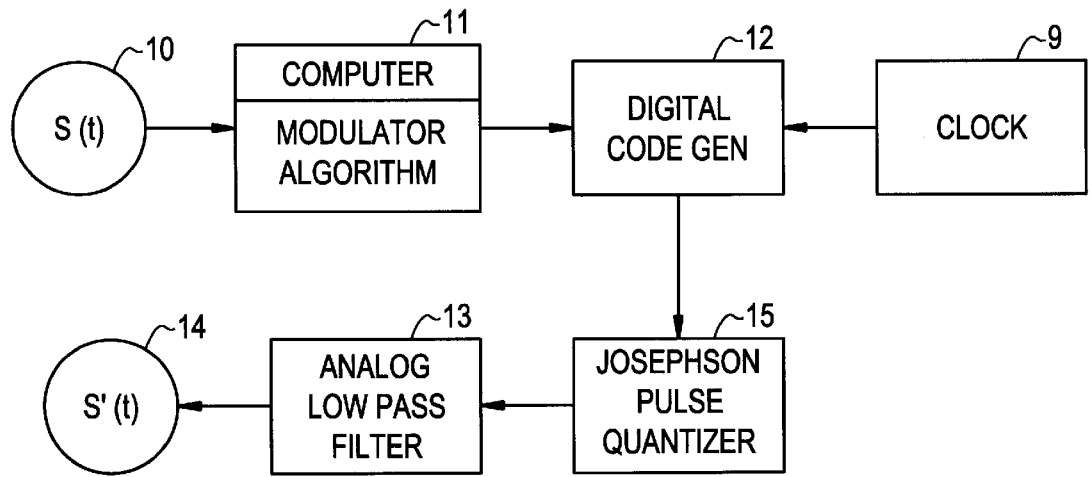

FIG. 2 is a prior art circuit providing a significant advance over the circuit of FIG. 1. In FIG. 2, a Josephson pulse quantizer 15 is provided to receive the digital code input. As mentioned above, the output of the digital code generator 12 is a two-level signal which rises from a zero level to a plus one level but does not produce an ideal two-level digital code because of small variations present in the code generator output. However, in using the Josephson pulse quantizer 15, the imperfect output of the code generator 12 is converted to a perfectly quantized output. The accuracy of the circuit is based on the fact that Josephson junctions generate voltage pulses whose time-integrated areas are perfectly quantized, that is, the area under each voltage pulse is equal to every other area under a voltage pulse, even though there may be some variation in the shape of the voltage pulses due to the imperfect input. Appropriate sequences of these quantized pulses are sent through a low pass filter to generate ac and dc waveforms with precisely calculable rms voltage. Applications of the device include (1) the generation of digitally synthesized ac signals with calculable rms voltages; (2) characterization of digital to analog (d/a) and analog to digital (a/d) converters; (3) calibration of dc and ac reference standards and volt meters; and (4) synthesis of low-phase-noise radar signals. U.S. Pat. No. 5,812,078 to Przybysz et al., incorporated herein by reference, shows circuits based upon the technology of FIG. 2. U.S. Pat. No. 5,565,866, also incorporated herein by reference provides selectable arrays of Josephson junctions for producing a desired output voltage.

Arrays of intrinsically shunted Josephson junctions comprised of Nb—PdAu—Nb junctions were developed for the prior art devices. Those chips have intrinsically stable, precise voltages over the range from −1.2 volts to +1.2 volts and are described in "Stable One Volt Programmable Voltage Standard," Benz et al., Applied Physics Letters 71, Sep. 29, 1997, page 1866, incorporated herein by reference. Fabrication of the junctions is described in "Superconductor-Normal-Superconductor Junctions of Programmable Voltage Standards," Benz, Applied Physics Letters 67, page 2714, incorporated herein by reference.

A binary sequence design has proved adequate for fast and stable programming of dc voltages but has not proven adequate for practical generation of fast ac waveforms. The problem is that switching time at each bias current driver is limited to about one microsecond. As a consequence, there is significant uncertainty in the average voltage during the switching time interval when the sinusoidal drive frequency is high. At 16 gigahertz (GHz), as many as 16,000 pulses may occur during each bias transition. Since many transitions are required to generate an accurate step approximation of a sine wave, the slow switching time produces an unacceptably large uncertainty in the rms voltage of a high frequency sine wave. As a consequence, this method of ac waveform generation is unsuitable for metrology applications. The invention herein is an improvement reducing the uncertainty in rms voltage to an acceptable level.

The technology of FIG. 2 is utilized in U.S. Pat. No. 5,812,078 for radar applications as well as in metrology. For radar applications, the desired waveform synthesis may include a band of both linear and nonlinear frequency modulated frequencies (chirp) with a predetermined frequency spectrum. The digital code generator provides a binary signal representative of the chirp signals. The quantizer provides an accurate reproduction of the digital signal for feeding a low pass filter. A low phase noise clock signal is employed and is mixed with filter output to provide a low phase noise signal for driving the generation of RF pulses for radar transmission.

U.S. Pat. No. 5,854,604 shows a stored digital waveform combined with the output of a clock before presentation to a Josephson junction array.

Figure 3A:
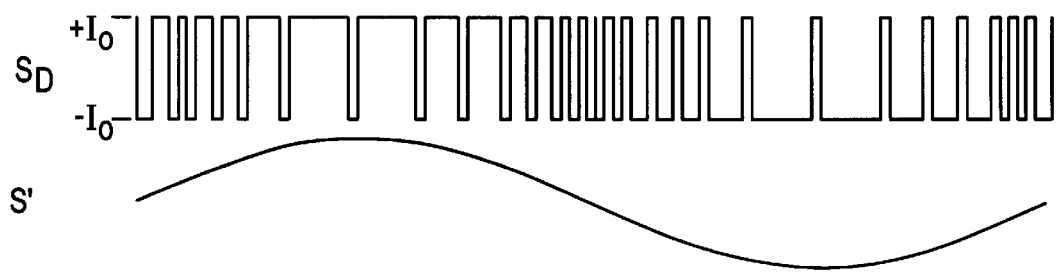
FIG. 3 illustrates the circuit of this invention.
Figure 3B:
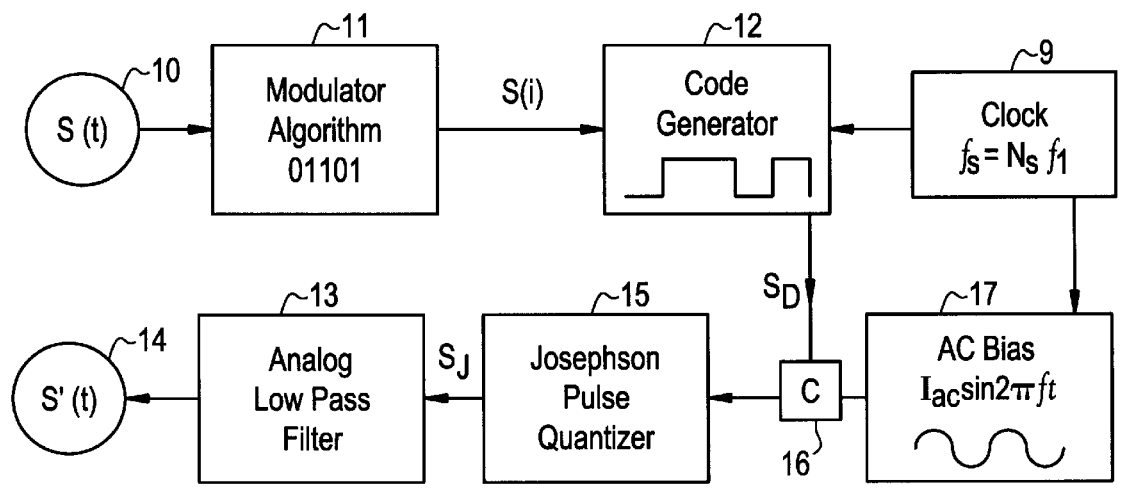

FIG. 3 shows the circuit of this invention. A mathematical model of an input waveform such as a sine wave, S' in FIG. 3(a), is utilized by computer 11 and a modulator algorithm running therein to produce a digital code sequence of zeros and ones representing a digitized mathematical model of the desired waveform. That code is provided as input to a digital code generator 12 for the production of a two-level signal, $S_D$ in FIG. 3(a), corresponding to the digital code. The digital code generator output is controlled with a clock 9 that is phase locked to the frequency generator 17. The two-level signal is combined with the output, $I_{ac} \sin 2\pi ft$, of a microwave frequency generator 17 in combining circuit 16 for input to the Josephson pulse quantizer 15. The output of quantizer 15 is sent through a low pass filter 13 to provide a physical representation 14 of the mathematical model 10. The result is an ac waveform such as a sine wave signal, which is a more exact replication of the mathematical model than was previously achieved by the circuits of U.S. Pat. No. 5,565,866 and produces a much higher voltage than was previously achieved by the circuits of U.S. Pat. No. 5,812,078. Moreover, a bipolar output is achieved by this invention.

Optimal generation of bipolar waveforms require specific frequency and phase relationships between the sampling and drive frequencies. The microwave drive frequency, f, should be at precisely half integer multiples of the sampling frequency $f_s$, and equal to $mf_s/2$, where the integer m is $\geq 2$. Operating margins are largest when transitions of the two level high speed bias occur at nodes of the drive sinusoidal frequency.

Figure 4:
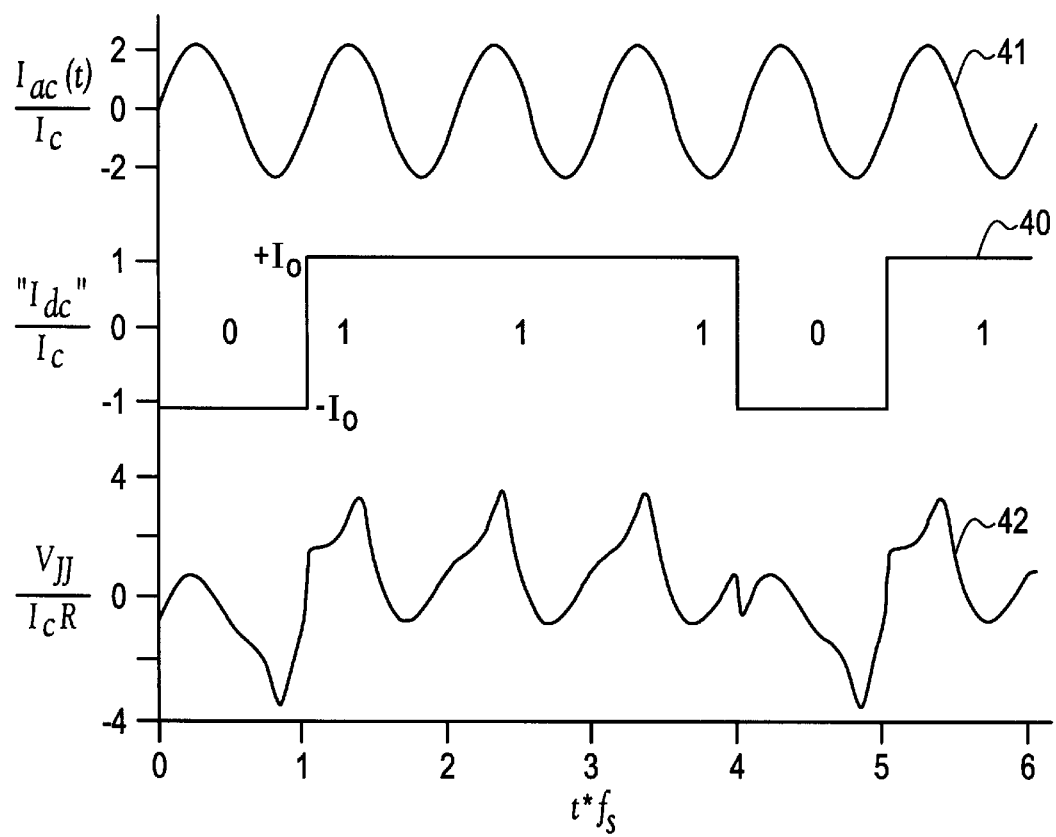
FIGS. 4 and 5 show the combination of waveforms in producing a drive signal for the Josephson junction quantizer of FIG. 3.

FIG. 4 shows simulated input and output waveforms for an example six bit code. It illustrates the combining of the digital code with microwave signals and how that combination changes the nature of the input to the quantizer 15. FIG. 4 shows the junction input currents and output voltage for the m=2 case where the digital code frequency is equal to the drive sinusoidal frequency, and the phases of the inputs are such that the transitions of the two-level digital code occur at nodes of the drive frequency. Simulations show that this is the optimum phase alignment between the two inputs.

The digital code in the example input is 011101, resulting in an output two-level signal 40 from the digital code generator. The signal 40 is combined with the sinusoidal microwave signal 41 to produce a resultant waveform signal which drives the Josephson device and results in the output waveform 42. As a result of the combination, a negative voltage pulse occurs in the junction output voltage 42 at a position which roughly corresponds to each code zero and a positive voltage pulse occurs roughly corresponding to each code 1. Thus, the number of pulses output from the Josephson device equals the number of code digits. Moreover, the pulses are bipolar, negative as well as positive. This result is considerably different from the circuit of FIG. 2 which was capable of producing only positive pulses at a maximum rate of one half the number of code digits. As a result, the circuit of FIG. 3 doubles the frequency of the Josephson device output thereby increasing output voltage, and in addition, makes it bipolar.

There are two distinctly different transitions in FIG. 4. At the 1-to-0 transitions, $f_s t = 4$ and 6, the digital code signal 40 decreases, approximately canceling the rising slope of the sine wave 41. However, at the 0-to-1 transitions, $f_s t = 1$ and 5, the sine wave and the digital code are both increasing resulting in a slope much steeper than the slope of the sine wave. Waveform 42 is the output of the Josephson junction and shows how the junction responds to the combined input. The steeper slope requires the junction to respond more quickly and decreases the operating current range. Fortunately, it is possible to remove all steeply sloped transitions and increase the operating current range by using odd integer m frequency ratios and a specific phase configuration.

Figure 5:
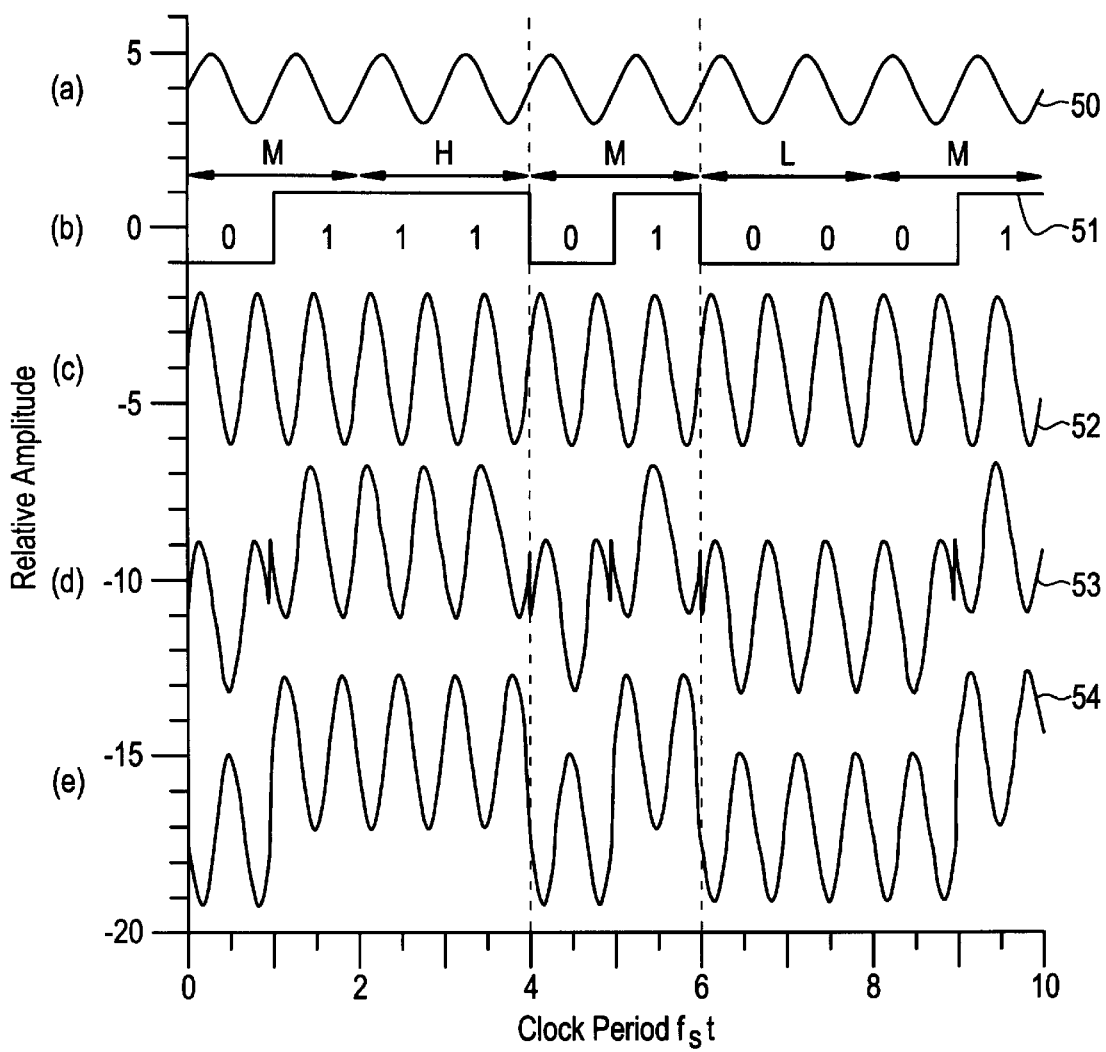

FIG. 5 shows a specific example of these odd integer frequency ratios where m=3. The input waveforms for the m=3 case show that the sinusoidal frequency 52 is 3/2 times the clock frequency 50. For these frequencies, all of the steeply rising edges are removed from the input code by separating the code into three pairs of consecutive bits, Low (00), Medium (01), and High (11). Requiring the Medium level to always be 01 and never 10 breaks the symmetry of the waveform. An example code and its corresponding waveform 51 are shown in FIG. 5(b) with the Low, Medium, and High pairs indicated. The combined input currents of FIGS. 5(b) and 5(c) when the code and sine wave are "in-phase" is shown by waveform 53 in FIG. 5(d). Note that there are no steep transitions. However, if the sine wave is phase shifted by 180°, that is, the "out-of-phase" case shown by waveform 54, then all of the transitions are steeply sloped as shown in FIG. 5(e). Note that the junction is pulsing twice as often for the 01 pattern in the out-of-phase case than the in-phase case. The "out of phase case" has lower operating current range because of the steep transitions and the larger number of pulses.

From the above, it is apparent that the inventive circuit develops bipolar waveforms. These waveforms enable the development of peak-to-peak bipolar voltages several times larger than previous devices which generated unipolar waveforms. Since a major limitation of Josephson devices is the low level of voltage output, the inventive circuit is a major advancement in that respect. Note, for example, that at maximum code frequency, the digital code generator creates pulses of a single polarity that return to zero every other bit. Thus, the maximum peak-to-peak unipolar voltage is limited to $nf_s/2K_J$. However, the inventive circuit yields a maximum peak-to-peak voltage of $mnf_s/K_J$, thereby producing output voltages which are 2m times larger than previously generated. Because of physical limitations on the rise time of the two-level signal generated by the digital code generator, the maximum practical frequency for the microwave signal is m=3. In such case, however, the peak-to-peak bipolar voltage produced by the invention is six times greater than the unipolar voltage of the prior art.

Other parameters determined for the inventive circuit are the junction critical current $I_c$, and characteristic frequency $f_c$, where $f_c=I_cRK_J$. R is the junction resistance. Many issues are involved in determining those values, including junction technology and uniformity, on-chip power dissipation, power uniformity to junctions distributed along a transmission line, system current noise, and current loading of the system when used as a voltage source. However, for optimum power, uniformity, and stability, the characteristic frequency should be approximately equal to the sinusoidal frequency.

With the characteristic frequency fixed, the critical current can be chosen. Since the maximum current range is proportional to the critical current, $I_c$ should be as large as possible for the lowest sensitivity to system noise and the largest possible load current.

The following procedure can be used to experimentally optimize the bias conditions for the bipolar voltage standard source operating at a maximum output voltage $V_1$ (n=1): (1) Find the fastest digital code generator available (e.g. $f_s$=12 GHz). (2) Fabricate junctions with $f_c$=1.5 $f_s$. (3) Set the sinusoidal frequency f=1.5 $f_s$. (4) Adjust the sinusoidal input current amplitude, $I_{ac}$, to maximize the n=1 step voltage. (5) Using an all 1's code, adjust the digital code high level current amplitude, $+I_o$, so that the current range of the n=+1 step of the Josephson junction is centered on the zero current axis. (6) Using an all 0's code, adjust the digital code low level, $-I_o$, so that the n=−1 step is centered on the zero current axis. (7) Find in-phase operation using the periodic 01 pattern by adjusting the relative phase between the code generator and the sinusoidal source until the current range of the 0 V step is maximized. Be aware that the current range should be 0 at a relative phase of ±90° and a lower relative maximum should occur at 180°.

In laboratory testing of the invention, a secondorder delta-sigma modulator algorithm was used to create the digital code. See "Delta-Sigma Converters: Theory, Design, and Simulation," S. R. Norsworthy et al., IEEE Press, 1997. ISBN 0-7803-1045-4. The digital code generator was a Hewlett-Packard Model HP70843A; the clock was a Hewlett-Packard HP70340A; the microwave generator was a Hewlett-Packard Model HP83650L; and the combining circuit was a Merimac CSMIOMISG 10 db coupler. The quantizer was produced in NIST laboratories and is described in the publications above, incorporated herein by reference. One thousand Josephson junctions were produced on a chip in a series array configuration.

Figure 6A:
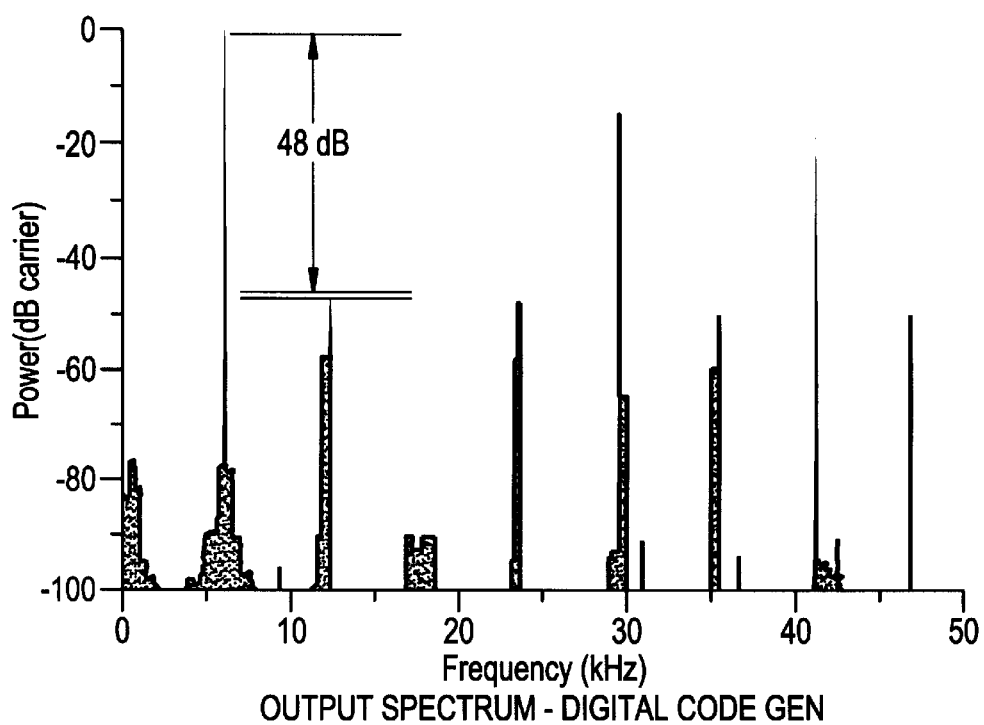
FIGS. 6 and 7 show experimental results for the circuit of FIG. 4.
Figure 6B:
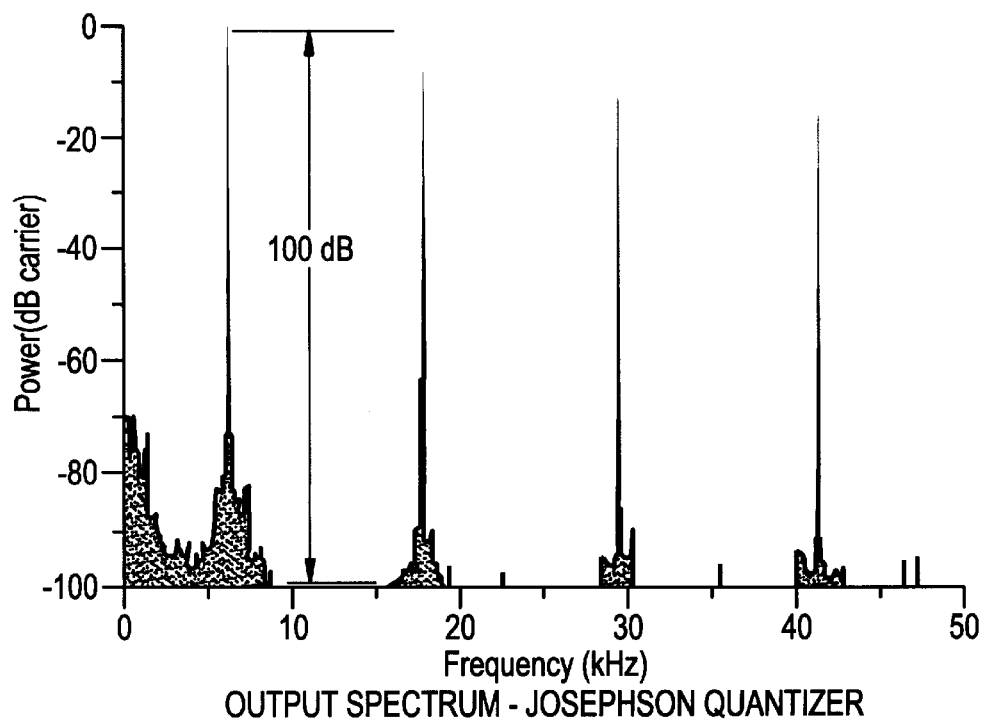
Figure 7A:
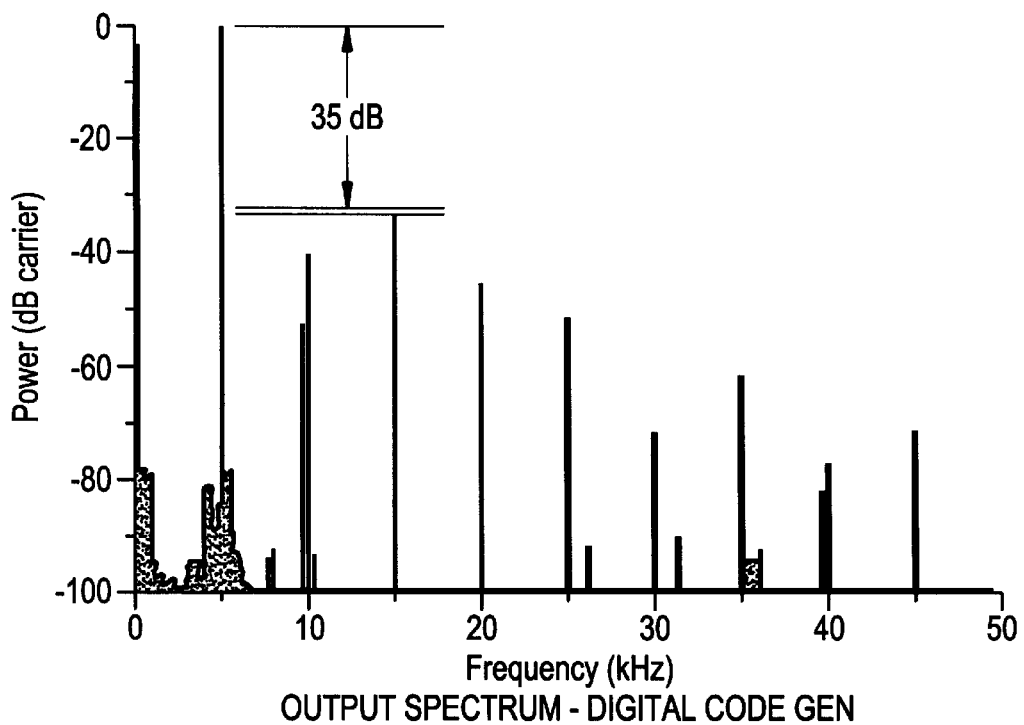
Figure 7B:
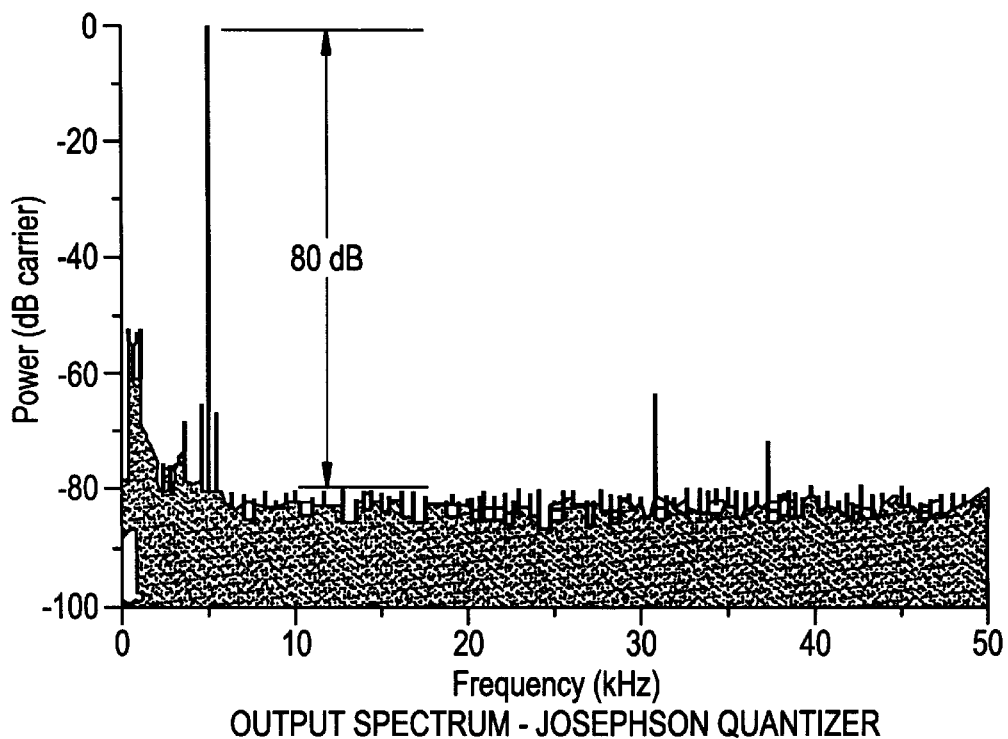

Experimental results are shown in FIGS. 6 and 7. Experimentally generated harmonic spectra of pulse-quantized bipolar voltage waveforms, FIGS. 6(b) and 7(b), are compared with spectra of the code generator output waveforms, FIGS. 6(a) and 7(a), for a synthesized square wave (FIG. 6) and a sine wave (FIG. 7). The digital code generator with a maximum clock frequency of 12 GHz has a 30 ps rise time. The generator has an internal time delay with picosecond resolution which allows adjustment of the phase of the digital code with respect to the sinusoidal drive signal. A 10 dB directional coupler is used for combining the broadband digital code signal with the sinusoidal drive frequency. The sinusoidal drive is applied to the coupled port and is phase locked to the clock signal through the 10 MHz reference signal. The broadband digital signal is applied to the through port (port 2). This arrangement allows sufficient isolation between the code and sine generators with minimal attenuation of the digital code signal. From the directional coupler, the broadband input path to the chip consists of about 1 m of semi-rigid coaxial cable, followed by about 5 cm of 50 ohm BeCu coplanar waveguide, which launches directly to the on-chip 50 ohm superconducting coplanar waveguide. The superconducting waveguide is terminated in a matched 50 ohm resistor. The Josephson quantizer is a 7-mm long array of 1000 junctions distributed along the center conductor of the superconducting waveguide. The voltage across the array is measured using a differential amplifier with a gain of 10. The amplifier removes the common mode signal of the termination resistor.

FIG. 6 compares the measured spectra of the digital code generator output, FIG. 6(a) with the amplified pulse quantized output, FIG. 6(b) for a 3.5 kHz square wave. The digital code is a periodic pattern of $6\times10^5$ 1's followed $6\times10^5$ 0's and is clocked at 4.2 GHz. The sinusoidal drive is 6.3 GHz corresponding to peak square wave voltages of ±13 mV. Pulse quantization reduces the power of the even harmonics from −48 dB by over 5 orders of magnitude to −100 dB (carrier).

FIG. 7 compares the measured spectra of the code generator, FIG. 7(a), and the quantized signals, FIG. 7(b), of a 5 kHz synthesized sine wave. A second-order delta-sigma modulator with $R_o$=256 is used to generate a $1.2\times10^6$ bit code for one period of the sine wave. The peak amplitude of the sine wave is chosen to be 0.95 $V_n$. Higher amplitudes overload the modulator and cause unwanted in-band noise. The digital code is clocked at 6 GHz. Using a sinusoidal drive frequency of 9 GHz corresponding to m=3, the peak amplitude of the sine wave is 17.7 mV. For the digital code generator signal, the highest in-band harmonic power is the third harmonic with −35 dB (carrier). The Josephson quantizer reduces the power of all the in-band harmonics to −80 dB (carrier). The remaining visible tones are caused by the computer monitor and are not related to the synthesized waveform.

These experimental results demonstrate bipolar ac waveform generation using a pulse-quantizing array of Josephson junctions. AC waveforms with high spectral purity and calculable rms voltages were generated showing that pulse quantization dramatically reduces particular types of distortions inherent in the output of conventional digital code generators. Further reductions in the measured harmonic noise power can be achieved with improved circuit designs by increasing the output voltage and the common mode rejection, and by decreasing the electromagnetic coupling between the code generator and the spectrum analyzer.

Additional improvements in the invention have centered in the modulator algorithm. For the 'odd-m' frequency and 'in-phase' timing configurations shown in FIG. 5, there are two ways to generate the appropriate digital code. The first uses any standard modulator algorithm (typically a second order delta-sigma modulator.) The second is a simple but very important modification to the modulator that increases the signal to noise ratio by decreasing the in-band harmonics of the quantization noise.

The first method uses a standard modulator that generates three output levels (Low, Middle, and High.) Then, a three-level to two-level transformation is added to the modulator's finished three-level code, so that the code can be implemented using the two-level code generator. In the transformation Low corresponds to two consecutive bits 00, middle corresponds to 01 and high corresponds to 11. Choosing 01 for the middle level fixes the relative phase between the code and sine wave so that the in-phase condition can apply to all bits. This technique successfully increases the operating margins for the code, but at the same time it decreases the signal-to noise ratio by increasing the in-band harmonics compared to the untransformed three-level modulator code. This results because the modulator cannot optimize the code at each 0 or 1 bit for the two-level operation.

The second method solves this problem by including the relative phase choice within the feedback loop of a two-level modulator algorithm. The in-phase condition requires that the code contain only odd numbers of consecutive identical bits, for example, three 1's and one 0, etc. Every two-level modulator has a comparator that determines whether the next bit is a 1 (signal is positive) or 0 (signal is negative.) The modified modulator of this invention allows the comparator to change the polarity of the next bit only if there is an odd number of previous consecutive bits of the same polarity. This restriction forces the code to have an odd number of consecutive bits of the same polarity. As a result, the new modulator directly generates two-level codes appropriate for the optimum in-phase condition and for improved operating margins. Since the restricted comparator is inside the feedback loop of the modulator, it improves signal-to-noise ratio compared to the first method.

Neither of these two methods for generating the code give signal to noise ratios as low as the standard two-level modulator, but they are essential for achieving the larger output voltages that are the main limitation for many useful Josephson applications. The large oversampling ratios that can be used for the metrology application yield significantly large signal-to-noise ratios so that signal-to-noise can be sacrificed for larger operating margins and output voltage.

While the invention has been shown and described with reference to preferred embodiments thereof, it should be understood that changes in the form and details of the invention may be made therein without departing from the spirit and scope of the invention.

What is claimed is:

1. A circuit for producing an electrical signal which is a replication of a mathematical model which can include ac and/or dc bipolar waveforms comprising:
    a modulator wherein an output sequence of zeros and ones produced by said modulator represents said mathematical model;
    a digital code generator connected to receive said output sequence from said modulator wherein an output digital code signal is produced to represent said mathematical model;
    a sinusoidal frequency generator whose output drive frequency is synchronized to said digital code;
    a Josephson quantizer connected to be driven by said digital code generator and said frequency generator wherein the quantized bipolar output pulses of said Josephson quantizer represent said mathematical model; and
    an analog low pass filter connected to receive said quantized bipolar output pulses and produce an output signal which is a replication of said mathematical model including models of ac and dc bipolar waveforms.

2. The circuit of claim 1 further including
    a synchronizing circuit producing a sampling frequency produced $f_s$, connected to said digital code generator and to said sinusoidal frequency generator.

3. The circuit of claim 2 wherein the drive frequency produced by said sinusoidal frequency generator is capable of being set to one of half integer multiples of said sampling frequency and equal to $mf_s/2$ where the integer m is $\geq 2$.

4. The circuit of claim 3 wherein m is equal to the integer 3.

5. The circuit of claim 3 wherein said modulator is a delta-sigma modulator.

6. The circuit of claim 3 wherein said Josephson quantizer is comprised of at least one Josephson junction.

7. The circuit of claim 6 wherein the maximum peak-to-peak output voltage of said at least one Josephson junction is equal to $Nnmf_s/K_J$ where N is the number of junctions, n is the Josephson junction constant voltage step number and is equal to the number of output voltage pulses produced for each input current pulse, $f_s$ is the sampling frequency and $K_J$ is the Josephson constant.

8. The circuit of claim 6 wherein said at least one Josephson junction is an Nb—PdAu—Nb junction.

9. The circuit of claim 3 further including a combining circuit connected to receive the output of said digital code generator and the output of said sinusoidal frequency generator and supply a combined signal to said quantizer.

10. The circuit of claim 9 wherein said combining circuit is a directional coupler.

11. The circuit of claim 3 optimized to produce a bipolar voltage standard source operating at maximum output voltage V at a first Josephson voltage step (n=1) according to an optimizing method comprising:
    (1) providing the fastest digital code generator available;
    (2) providing at least one Josephson junction with a characteristic frequency, $f_c=1.5f_s$;
    (3) providing a sinusoidal frequency $f=1.5f_s$;
    (4) providing sinusoidal input current amplitude, $I_{ac}$, to maximize said n=1 step voltage;
    (5) providing for the centering of the Josephson junction current range on the zero current axis at the n=+1 step by adjusting the digital code high level current amplitude when using an all 1's code;
    (6) providing for the centering of the Josephson junction current range on the zero current axis at the n=−1 step by adjusting the digital code low level current amplitude when using an all 0's code; and
    (7) providing for in-phase operation between the digital code generator and said sinusoidal frequency generator.

12. The circuit of claim 3 wherein the integer m is an odd integer and wherein said modulator includes a three-level comparator, said circuit further including a transformation algorithm to change the modulator's finished three-level code to a two-level code by having low correspond to 00, middle correspond to 01, and high correspond to 11 to establish in-phase condition between said output sequence and said sine wave.

13. The circuit of claim 12 wherein m is equal to the integer 3.

14. The circuit of claim 13 wherein said modulator is a delta-sigma modulator.

15. The circuit of claim 3 wherein the integer m is an odd integer and wherein said modulator includes a two-level comparator modified to allow the polarity of the next output bit to change only if there is an odd number of previous consecutive bits of the same polarity.

16. The circuit of claim 15 wherein m is equal to the integer 3.

17. The circuit of claim 16 wherein said modulator is a delta-sigma modulator.

18. A method for producing a bipolar standard voltage source utilizing Josephson junction devices comprising providing for a modulator to produce an output sequence of zeros and ones to represent an input mathematical model of a desired voltage waveform;

providing for the generation of a two-level electrical signal representing said mathematical model in accordance with said output sequence;

providing for a sinusoidal drive frequency synchronized to said two-level signal;

providing for a Josephson quantizer to be driven by the combination of said two-level signal and said sinusoidal drive frequency; and providing for the bipolar filtering of the output signal from said quantizer to produce a physical replication of said mathematical model wherein said combination driving said Josephson quantizer is bipolar and thereby enables a significantly increased bipolar output voltage amplitude relative to methods which do not employ a sinusoidal drive.

19. The method of claim 18 further including providing for a sampling frequency, $f_s$, to synchronize said two-level signal and said drive frequency;

providing for said drive frequency to be set to one of half integer multiples of said sampling frequency and equal to $mf_s/2$, where the integer m is $\geq 2$; and providing for an in-phase relationship between said two-level signal and said drive frequency.

20. The method of claim 19 wherein provision is made for setting m to an odd integer and wherein said modulator is a standard modulator that generates three output levels, said method further including providing for a three-level to two-level transformation of modulator output wherein low corresponds to two consecutive bits 00, middle corresponds to 01, and high corresponds to 11 to fix the relative phase between the two-level signal and the drive sine wave so that in-phase condition applies to all bits.

21. The method of claim 19 wherein provision is made for setting m to an odd integer and wherein said modulator is a two-level modulator modified to allow a comparator within said modulator to change the polarity of the next bit only if there is an odd number of previous consecutive bits of the same polarity, and thereby directly generate two-level codes at the in-phase condition.

* * * * *